(12) United States Patent
Huang et al.

(10) Patent No.: US 11,585,832 B2
(45) Date of Patent: Feb. 21, 2023

(54) PROBE CARD AND PROBE MODULE THEREOF

(71) Applicant: MPI Corporation, Chu-pei (TW)

(72) Inventors: Chung-Yen Huang, Hsinchu County (TW); Chih-Wei Wen, Hsinchu County (TW); Sheng-Feng Xu, Hsinchu County (TW); Fuh-Chyun Tang, Hsinchu County (TW); Chih-Hao Ho, Hsinchu County (TW)

(73) Assignee: MPI CORPORATION, Chui-Pei (TW)

( * ) Notice: Subject to any disclaimer, the term of this patent is extended or adjusted under 35 U.S.C. 154(b) by 0 days.

(21) Appl. No.: 17/221,368

(22) Filed: Apr. 2, 2021

(65) Prior Publication Data
US 2021/0311095 A1  Oct. 7, 2021

(30) Foreign Application Priority Data

Apr. 6, 2020 (TW) .................................. 109111547

(51) Int. Cl.
*G01R 1/073* (2006.01)

(52) U.S. Cl.
CPC ..... *G01R 1/07342* (2013.01); *G01R 1/07357* (2013.01)

(58) Field of Classification Search
CPC ............ G01R 1/07342; G01R 1/07357; G01R 1/0466; G01R 1/0491; G01R 1/07314; G01R 31/2863; G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07321; G01R 1/07328; G01R 1/07335; G01R 1/0735;
(Continued)

(56) References Cited

U.S. PATENT DOCUMENTS

| 2010/0013508 A1* | 1/2010 | Nozaki | G01R 1/07342 324/756.03 |
| 2014/0306729 A1* | 10/2014 | Chen | G01R 1/07378 324/750.22 |
| 2017/0315149 A1* | 11/2017 | Chen | G01R 1/07307 |

FOREIGN PATENT DOCUMENTS

| TW | I425218 B | 2/2014 |
| TW | 201835578 A | 10/2018 |

* cited by examiner

*Primary Examiner* — Lee E Rodak
(74) *Attorney, Agent, or Firm* — Birch, Stewart, Kolasch & Birch, LLP

(57) ABSTRACT

A probe card and a probe module thereof are provided. The probe card includes a first strengthening board, a fixed frame, a probe module, and a slidable frame. The first strengthening board includes a top surface, a bottom surface, and a mounting hole. An inner wall of the mounting hole is formed with an inner flange. The fixed frame is disposed on the top surface of the first strengthening board and surrounds the mounting hole. The probe module is disposed in the mounting hole and includes an outer flange including a physical region and multiple gap regions. The physical region abuts against the inner flange of the first strengthening board. The slidable frame is disposed on an inner wall of the fixed frame and is slidable between a released position and a fixed position. Multiple pressing portions are disposed on an inner wall of the slidable frame.

13 Claims, 12 Drawing Sheets

(58) Field of Classification Search
CPC ............ G01R 1/07364; G01R 1/07371; G01R 1/07378; G01R 1/07385; G01R 1/07392
See application file for complete search history.

PROBE CARD AND PROBE MODULE THEREOF

CROSS-REFERENCE TO RELATED APPLICATION

This non-provisional application claims priority under 35 U.S.C. § 119(a) to Patent Application No. 109111547 filed in Taiwan, R.O.C. on Apr. 6, 2020, the entire contents of which are hereby incorporated by reference.

BACKGROUND

Technical Field

The present invention relates to a probe card applicable to semiconductor testing and a probe module thereof.

Related Art

In a current wafer-level semiconductor test method, probing is a common method. In a test device used for probing, a probe card is the most critical main element. For example, in the Republic of China patent No. I425218, a probe card component provided in the patent mainly includes a circuit substrate, a reinforcement board fixed on the circuit substrate, an adjustment board disposed on the reinforcement board, and a probe head assembly fixed under the adjustment board. The probe head assembly passes through a central through hole of the circuit substrate and a central through hole of the reinforcement board. The probe head assembly mainly includes a probe insert provided with a plurality of probes, and a probe insert support that carries the probe insert and that is locked by using a screw. The probes are located under the circuit substrate and used to touch a to-be-tested object. The probes are electrically connected to a connector on the circuit substrate by using a plurality of conductive guide pins and wires, and are further electrically connected to a test machine by using the connector.

The probe head assembly is locked to the adjustment board by using a plurality of bolts and nuts. The adjustment board is fixed to the reinforcement board by using a plurality of locking screws, and a plurality of adjustment screws pass through the adjustment board and abut against the reinforcement board. When the locking screws do not tightly press the adjustment board against the reinforcement board, and there is a gap between the adjustment board and the reinforcement board, each of the adjustment screws can be rotated by a user to make a part of the adjustment board at which the adjustment screw is located close to or away from the reinforcement board. In this case, an orientation of the reinforcement board relative to the circuit substrate is adjusted in a time-consuming manner, to enable tips of the probes to have acceptable flatness relative to the to-be-tested object by correcting an orientation of each probe relative to the to-be-tested object.

However, a complex structure of the probe card leads to time-consuming assembly and difficult disassembly, resulting in considerable inconvenience to semiconductor test personnel.

SUMMARY

The present invention provides a probe card, including a first strengthening board, a fixed frame, a probe module, and a slidable frame. The first strengthening board includes a top surface, a bottom surface, and a mounting hole, where an inner wall of the mounting hole includes an inner flange. The fixed frame is disposed on the top surface of the first strengthening board and surrounds the mounting hole. The probe module is disposed in the mounting hole and includes a top surface, a bottom surface, and an outer flange located between the top surface and the bottom surface. The outer flange includes a physical region and a plurality of gap regions, and the physical region of the outer flange abuts against the inner flange of the first strengthening board. The probe module further includes a circuit substrate, the bottom surface of the probe module is a bottom surface of the circuit substrate, and the bottom surface of the circuit substrate is provided with a plurality of pogo pins and a plurality of probes. The slidable frame is disposed on an inner wall of the fixed frame and is slidable between a released position and a fixed position along an axial direction. A plurality of pressing portions are disposed on an inner wall of the slidable frame. When the slidable frame is located at the released position, each of the pressing portions individually corresponds to one of the gap regions of the outer flange of the probe module. When the slidable frame is located at the fixed position, each of the pressing portions presses the physical region of the outer flange of the probe module. A test circuit board includes a top surface, a bottom surface, a through hole, and a plurality of electrical contacts. The electrical contacts are located on the top surface of the test circuit board and around the through hole. The top surface of the test circuit board is fixedly connected to the bottom surface of the first strengthening board. The through hole of the test circuit board is opposite to the mounting hole of the first strengthening board, the pogo pins of the probe module are individually electrically connected to the electrical contacts of the test circuit board and the circuit substrate, and the probes of the probe module protrude from the bottom surface of the test circuit board.

The present invention further provides a probe module, disposed in a mounting hole of a first strengthening board, where an inner wall of the mounting hole includes an inner flange. The probe module includes a second strengthening board and a circuit substrate. The second strengthening board includes an outer flange, where the outer flange includes a physical region and a plurality of gap regions, and the physical region abuts against the inner flange of the mounting hole of the first strengthening board. The circuit substrate is disposed below the second strengthening board and includes a bottom surface, where a plurality of conductors and a plurality of probe are disposed on the bottom surface, and at least one of the conductors is electrically connected to one of the probes.

In the probe card provided in the present invention, assembly and disassembly of the probe module can be easily implemented by sliding the slidable frame between the released position and the fixed position through the slidable frame relative to the fixed frame, thereby effectively resolving the problem of difficult assembly and disassembly of the probe module of the probe card in the prior art.

DETAILED DESCRIPTION

Figure 1A:
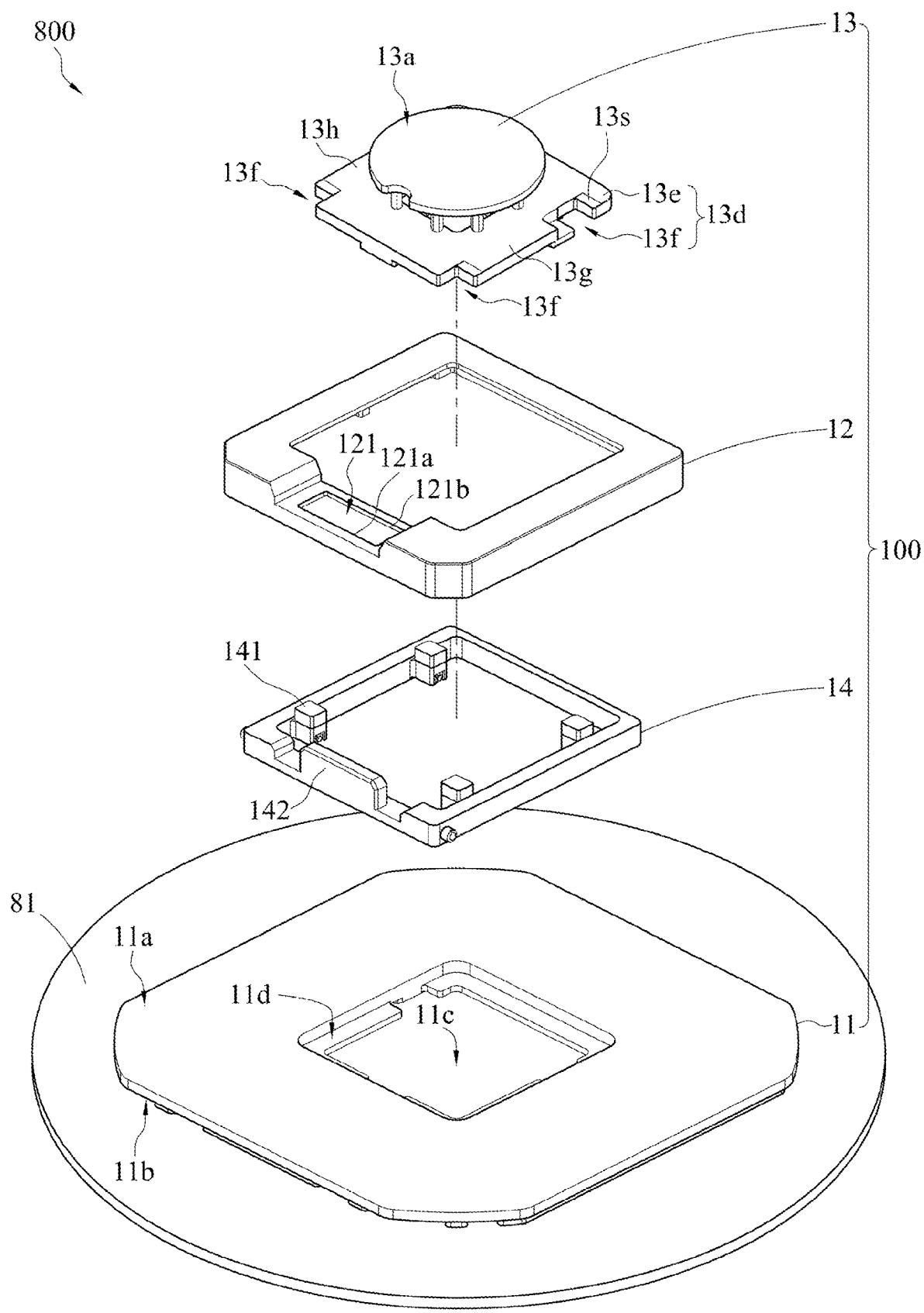
FIG. 1A is a schematic exploded view of elements of a probe card according to a first embodiment of the present invention.

In the following embodiments, a term "up" or "down" is merely used for describing an orientation shown in the drawings, instead of limiting an actual orientation.

First Embodiment

Referring to FIG. 1A to FIG. 4, an exemplary probe card 800 is illustrated, and the probe card 800 is formed by combining a probe card component 100 with a test circuit board 81.

Figure 3:
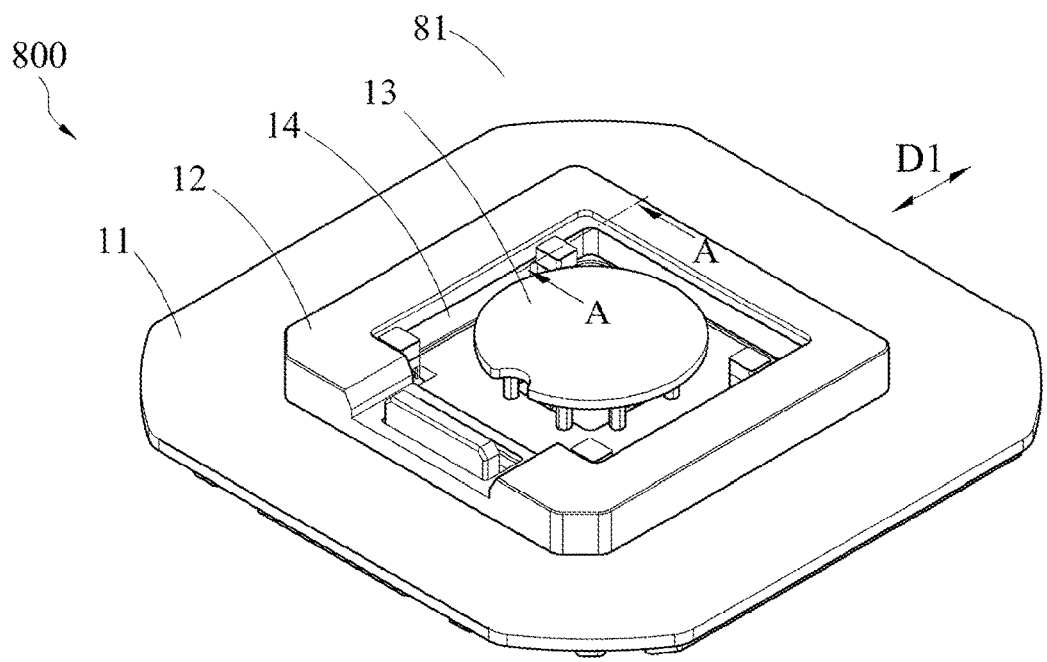
FIG. 3 is a schematic diagram of the probe module according to the first embodiment of the present invention in a released state.
Figure 4:
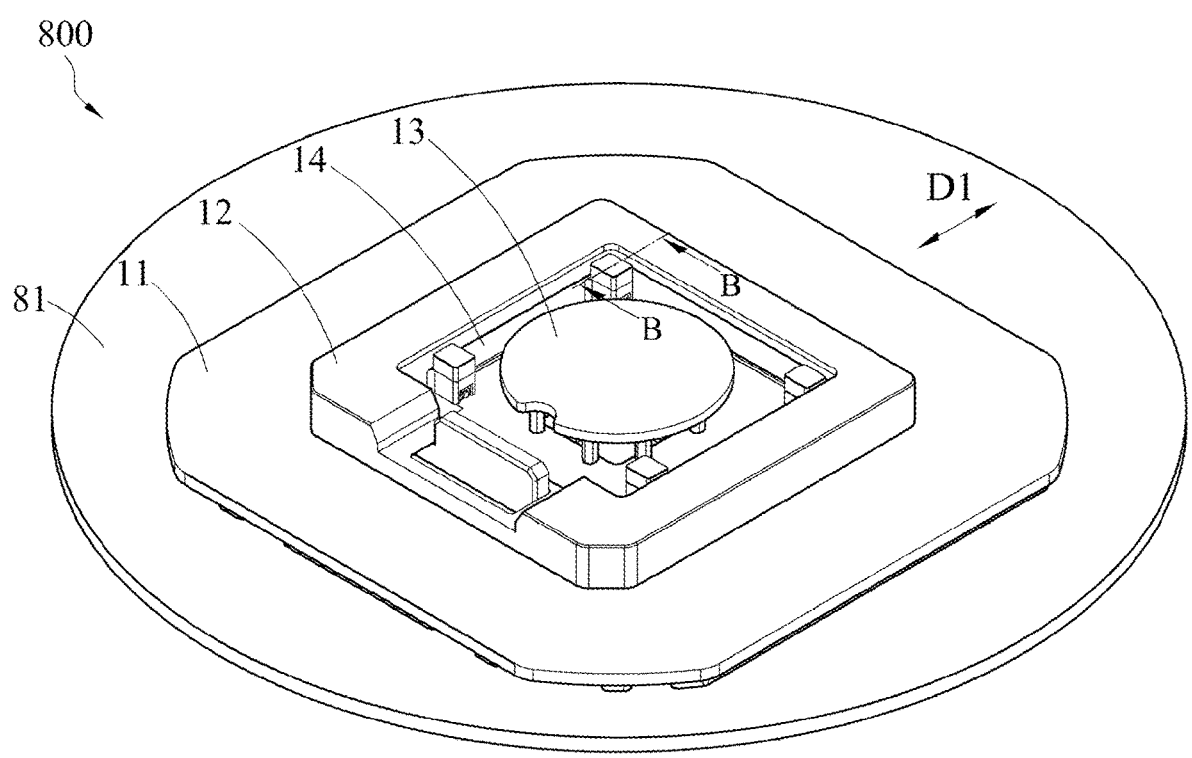
FIG. 4 is a schematic diagram of the probe module according to the first embodiment of the present invention in a fixed state.

The probe card module 100 mainly includes a first strengthening board 11, a fixed frame 12, a probe module 13, and a slidable frame 14. The first strengthening board 11 includes a top surface 11a, a bottom surface 11b, and a mounting hole 11c, where an inner wall of the mounting hole 11c includes an inner flange 11d. The first strengthening board 11 may be made of a metal material, for example, aluminum, aluminum alloy, or another metal material, and is used for combining with one side of the test circuit board 81 (as shown in FIG. 3 and FIG. 4) to strengthen the rigidity of the test circuit board 81. The fixed frame 12 is disposed on the top surface 11a of the first strengthening board 11 and surrounds the mounting hole 11c. The probe module 13 is disposed in the mounting hole 11c and includes a top surface 13a, a bottom surface 13b, and an outer flange 13d located between the top surface 13a and the bottom surface 13b. The outer flange 13d includes a physical region 13e and a plurality of gap regions 13f (four gap regions 13f are drawn in the figure), and the physical region 13e of the outer flange 13d abuts against the inner flange 11d of the first strengthening board 11. As shown in FIG. 1B, the probe module 13 includes an upper cover 131, a second strengthening board 133, and a circuit substrate 134 from top to bottom. The outer flange 13d of the probe module 13 is located on the second strengthening board 133, and the top surface 13a and the bottom surface 13b of the probe module 13 are respectively located on the upper cover 131 and the circuit substrate 134. A top surface of the circuit substrate 134 is fixedly connected to a bottom surface of the second strengthening board 133.

The slidable frame 14 is disposed on an inner wall of the fixed frame 12 and is slidable between a released position (a state shown in FIG. 3 and FIG. 6) and a fixed position (a state shown in FIG. 4 and FIG. 7) along an axial direction D1 (a direction indicated by an arrow shown in FIG. 3 and FIG. 4). A plurality of pressing portions 141 (four pressing portions 141 are drawn in the figure) are disposed on an inner wall of the slidable frame 14. When the slidable frame 14 is located at the released position shown in FIG. 3, each of the pressing portions 141 individually corresponds to one of the gap regions 13f of the outer flange 13d of the probe module 13. When the slidable frame 14 is located at the fixed position shown in FIG. 4, each of the pressing portions 141 presses the physical region 13e of the outer flange 13d of the probe module 13.

Through the foregoing embodiment, assembly and disassembly of the probe module 13 can be implemented only by controlling the slidable frame 14 to slide relative to the fixed frame 12 along the axial direction D1. When an assembly process is to be performed, the slidable frame 14 may be first slid along the axial direction D1 to the released position shown in FIG. 3, and then the probe module 13 is placed in the mounting hole 11c of the first strengthening board 11. Afterward, the assembly of the probe module 13 can be completed by only sliding the slidable frame 14 along the axial direction D1 to the fixed position shown in FIG. 4. Similarly, when the disassembly of the probe module 13 is to be performed by personnel, the foregoing assembly process only needs to be reversely performed.

In some embodiments, the outer flange 13d of the probe module 13 includes a first side 13g and a second side 13h that are opposite and parallel to each other, and the first side 13g and the second side 13h are parallel to the axial direction D1. The gap regions 13f of the outer flange 13d of the probe module 13 are respectively located on the first side 13g and the second side 13h, and a quantity of the gap regions 13f located on the first side 13g is equal to that of the gap regions 13f located on the second side 13h. In addition, each of the gap regions 13f individually corresponds to one of the pressing portions 141 of the slidable frame 14, so that a quantity of the pressing portions 141 is also equally distributed along two sides of the axial direction D1. The outer flange 13d of the probe module 13 is located on the second strengthening board 133.

Figure 6:
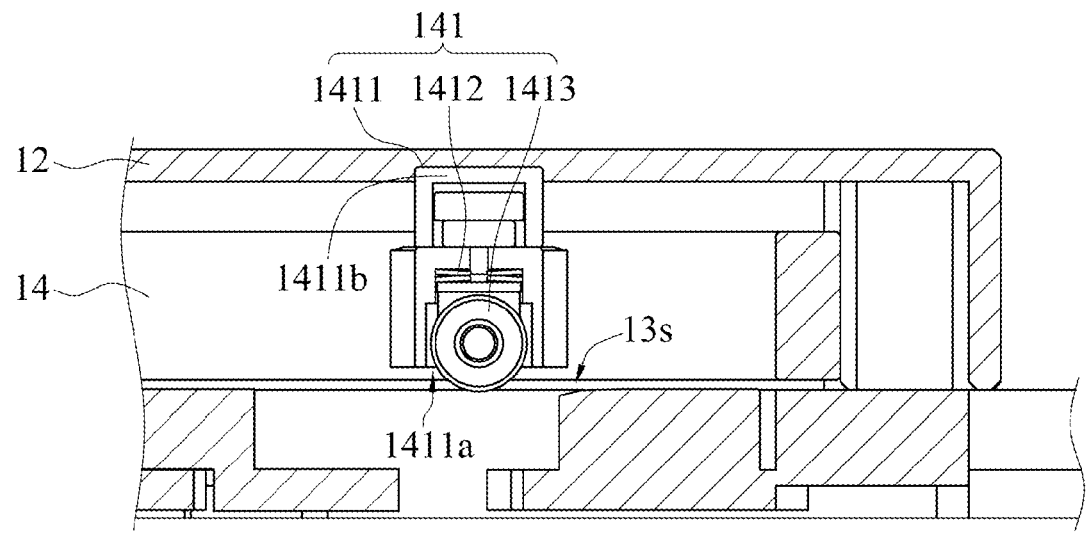
FIG. 6 is a schematic cross-sectional view of a pressing portion according to the first embodiment of the present invention along a section line AA in FIG. 3.
Figure 7:
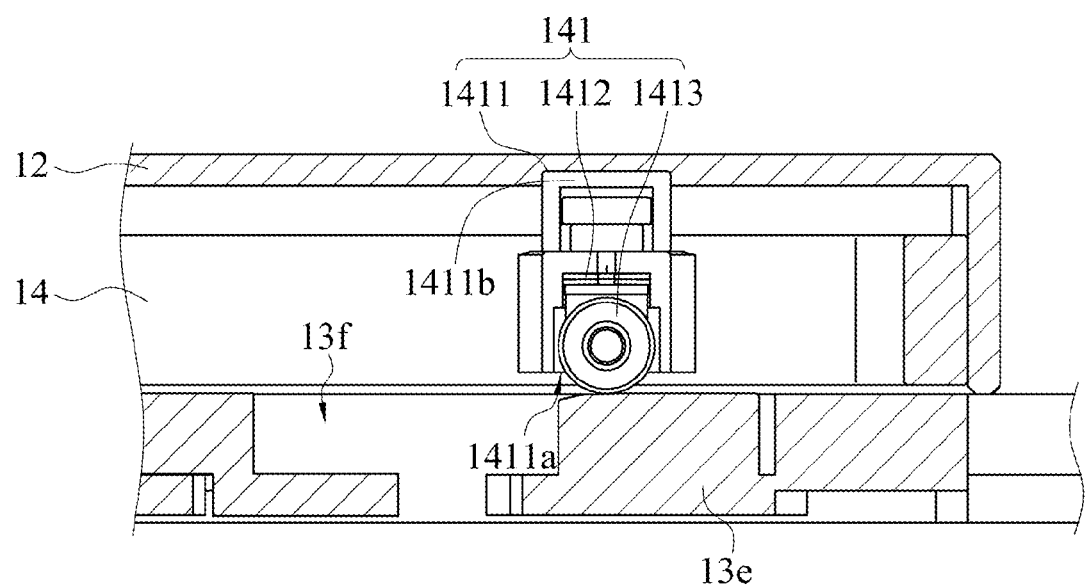
FIG. 7 is a schematic cross-sectional view of a pressing portion according to the first embodiment of the present invention along a section line BB in FIG. 4.

Referring to FIG. 6 and FIG. 7 again, in some embodiments, each of the pressing portions 141 of the slidable frame 14 includes a housing 1411, an elastic body 1412, and a roller 1413. The housing 1411 is fixedly connected to the inner wall of the slidable frame 14 and has an opening 1411a and an end wall 1411b opposite to the opening 1411a. The elastic body 1412 is disposed in the housing 1411 and has one end fixedly connected to the end wall 1411b and the other end connected to the roller 1413. In addition, the physical region 13e of the outer flange 13d of the probe module 13 further includes a plurality of ramp structures 13s, and the ramp structures 13s are individually adjacent to the gap regions 13f.

When the slidable frame 14 is located at the released position shown in FIG. 3 and FIG. 6, a position of the pressing portion 141 is above the gap region 13f of the outer flange 13d of the probe module 13, that is, the roller 1413 is not in contact with the physical region 13e of the outer flange 13d of the probe module 13. In this case, the elastic body 1412 is not compressed, and a lower edge of the roller 1413 also presents a state of being slightly lower than a top surface of the physical region 13e of the outer flange 13d of the probe module 13. When the slidable frame 14 is pushed to slide from the released position to the fixed position, the roller 1413 of each of the pressing portions 141 moves and climbs along a surface of the ramp structure 13s from a gap region 13f corresponding thereto, and further moves to the physical region 13e of the outer flange 13d. When the slidable frame 14 is located at the fixed position shown in FIG. 4 and FIG. 7, the elastic body 1412 is in a compressed state, so that the roller 1413 applies downward pressure to the physical region 13e of the outer flange 13d, thereby fixing the probe module 13 to the mounting hole 11c of the first strengthening board 11.

Figure 1B:
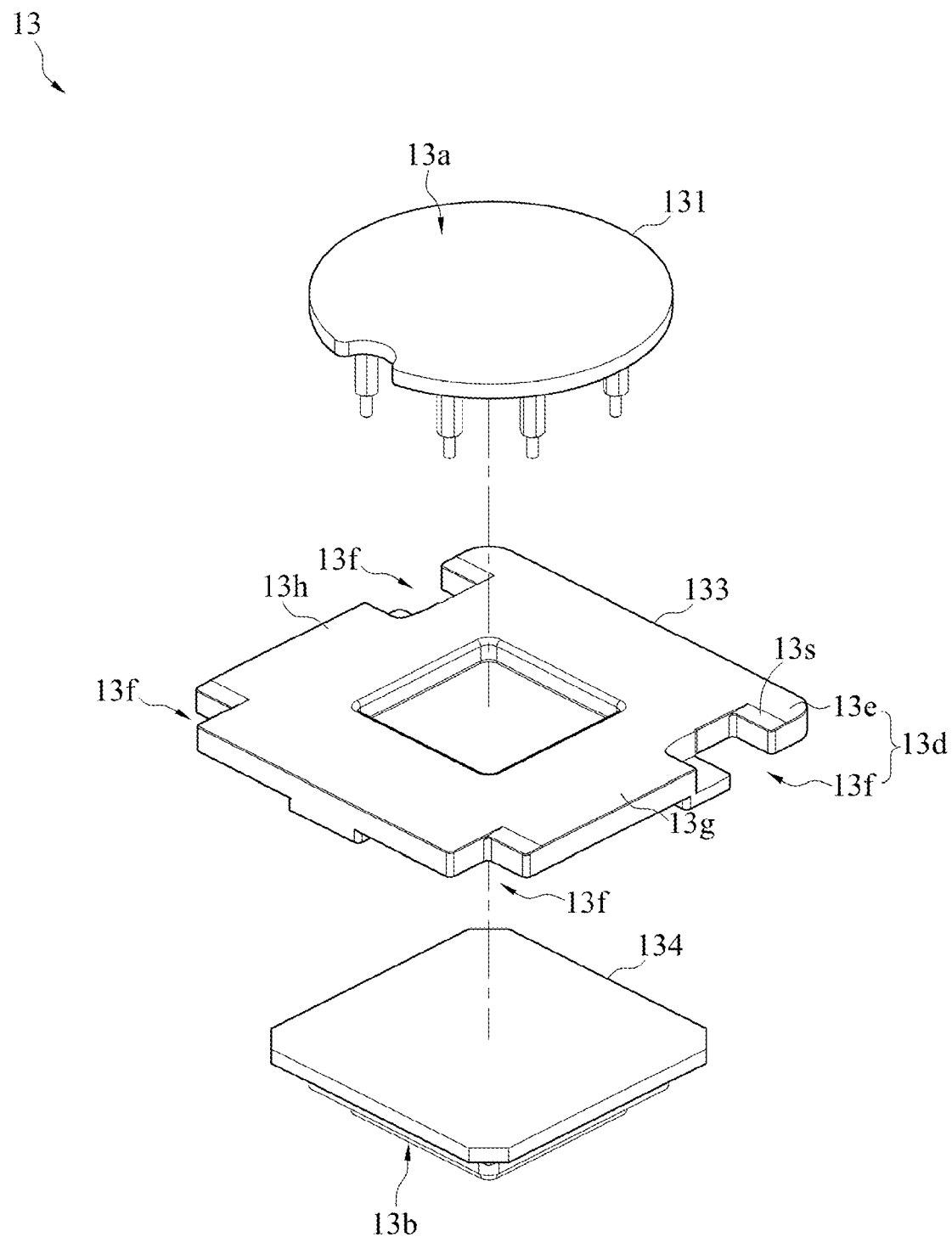
FIG. 1B is a schematic exploded view of elements of a probe module according to the first embodiment of the present invention.
Figure 2:
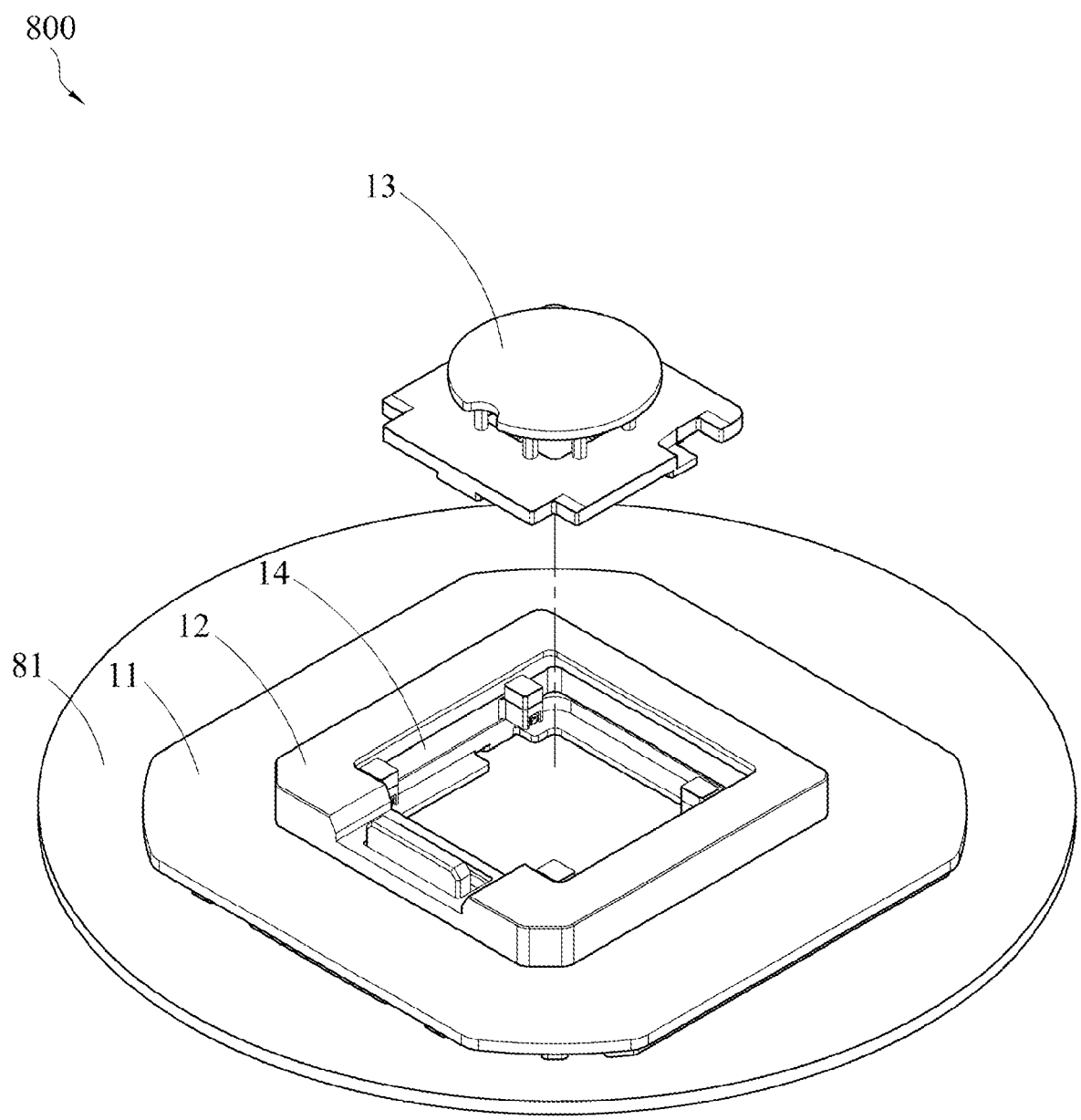
FIG. 2 is a schematic diagram of a combination of the probe module according to the first embodiment of the present invention and a strengthening board.

Referring to FIG. 1A and FIG. 2, in some embodiments, the fixed frame 12 has a through hole 121, and the slidable frame 14 includes a handle portion 142 passing through the through hole 121. The through hole 121 includes a first inner wall surface 121a and a second inner wall surface 121b opposite to each other. When the slidable frame 14 is located at the released position shown in FIG. 3, the handle portion 142 abuts against the first inner wall surface 121a of the through hole 121. When the slidable frame 14 is located at the fixed position shown in FIG. 4, the handle portion 142 abuts against the second inner wall surface 121b of the through hole 121.

Figure 5:
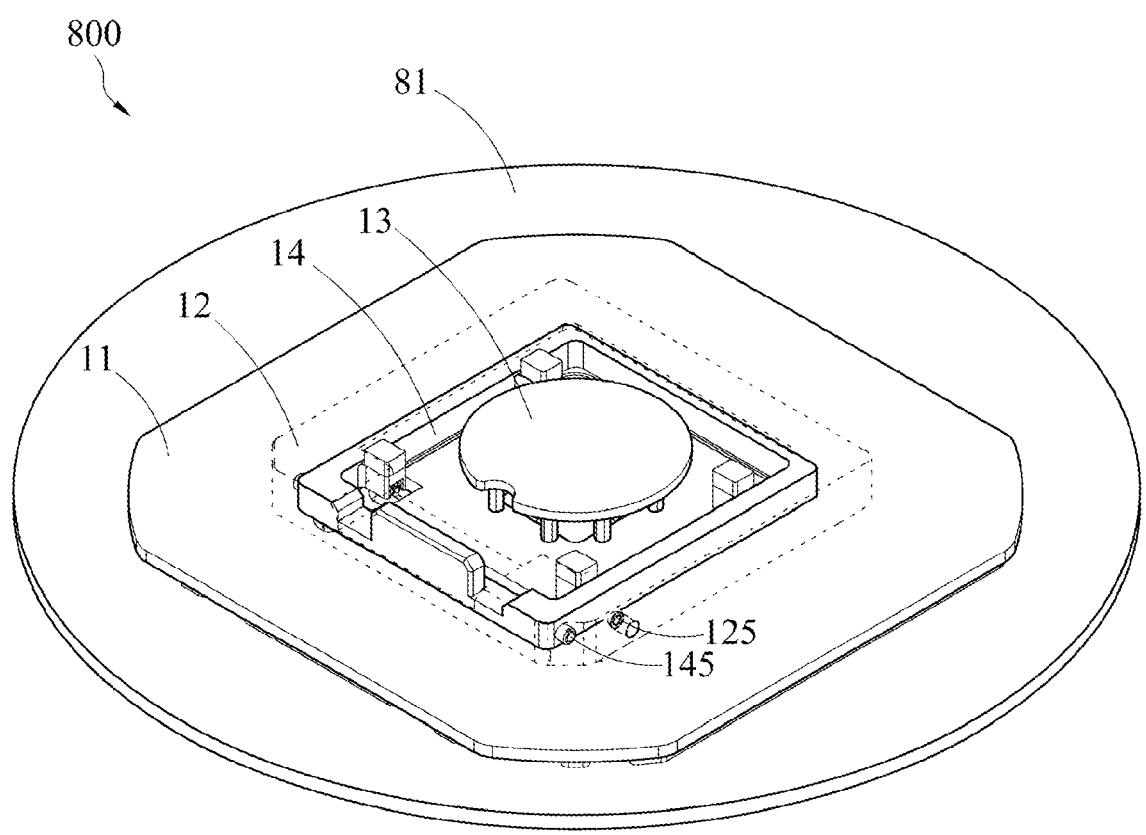
FIG. 5 is a local perspective view of a probe card according to the first embodiment of the present invention.

Referring to FIG. 5, in some embodiments, at least one ball plunger 125 is further disposed on the inner wall of the fixed frame 12, and an outer wall of the slidable frame 14 is further provided with at least one positioning hole 145. The ball plunger 125 may extend and contract along a normal direction of a wall surface of the inner wall of the fixed frame 12, and when the slidable frame 14 is located at the fixed position shown in FIG. 4, the ball plunger 125 of the fixed frame 12 is embedded into the positioning hole 145 of the slidable frame 14. It should be particularly noted that, a position of the ball plunger 125 and a position of the positioning hole 145 are interchangeable. That is, the ball plunger 125 may be disposed on the outer wall of the slidable frame 14, and the positioning hole 145 can be provided in the inner wall of the fixed frame 12.

Second Embodiment

Referring to FIG. 8A, FIG. 8B, FIG. 9, and FIG. 14, an exemplary probe card component 200 and an exemplary probe card 900 are illustrated, and the probe card 900 is formed by combining the probe card component 200 with a test circuit board 91.

Figure 10:
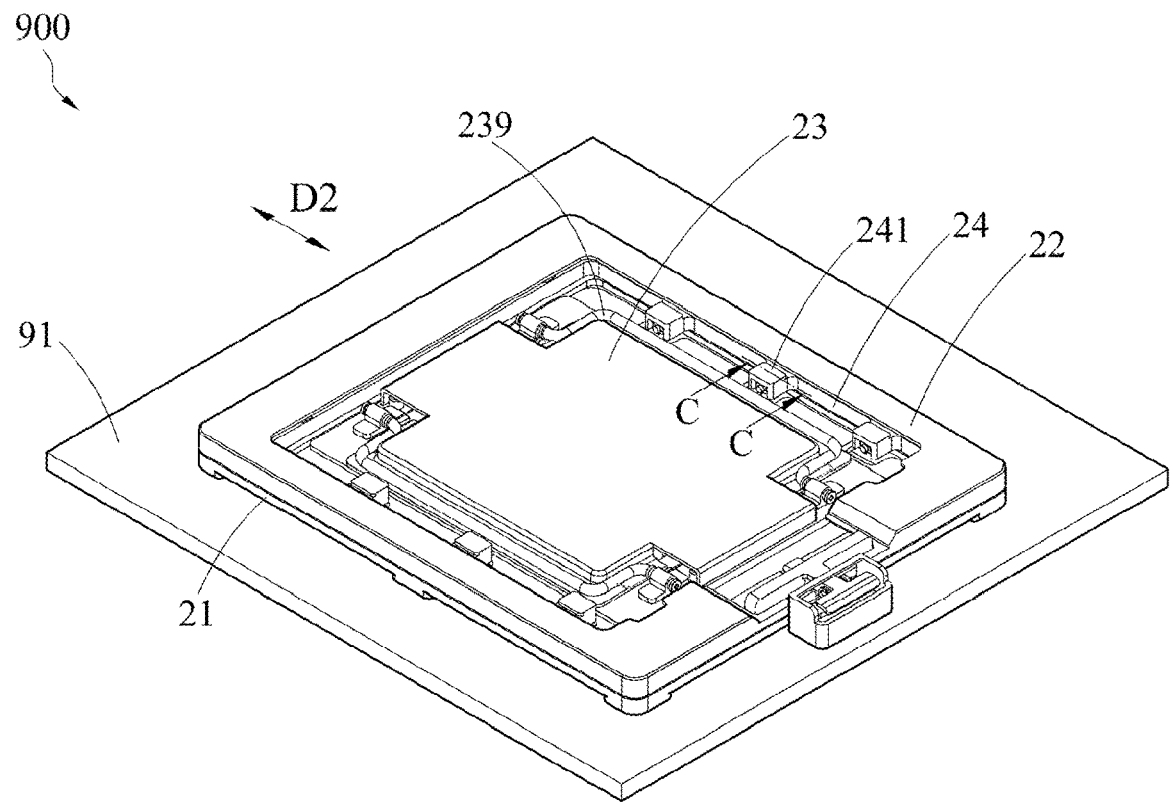
FIG. 10 is a schematic diagram of the probe module according to the second embodiment of the present invention in a released state.
Figure 11:
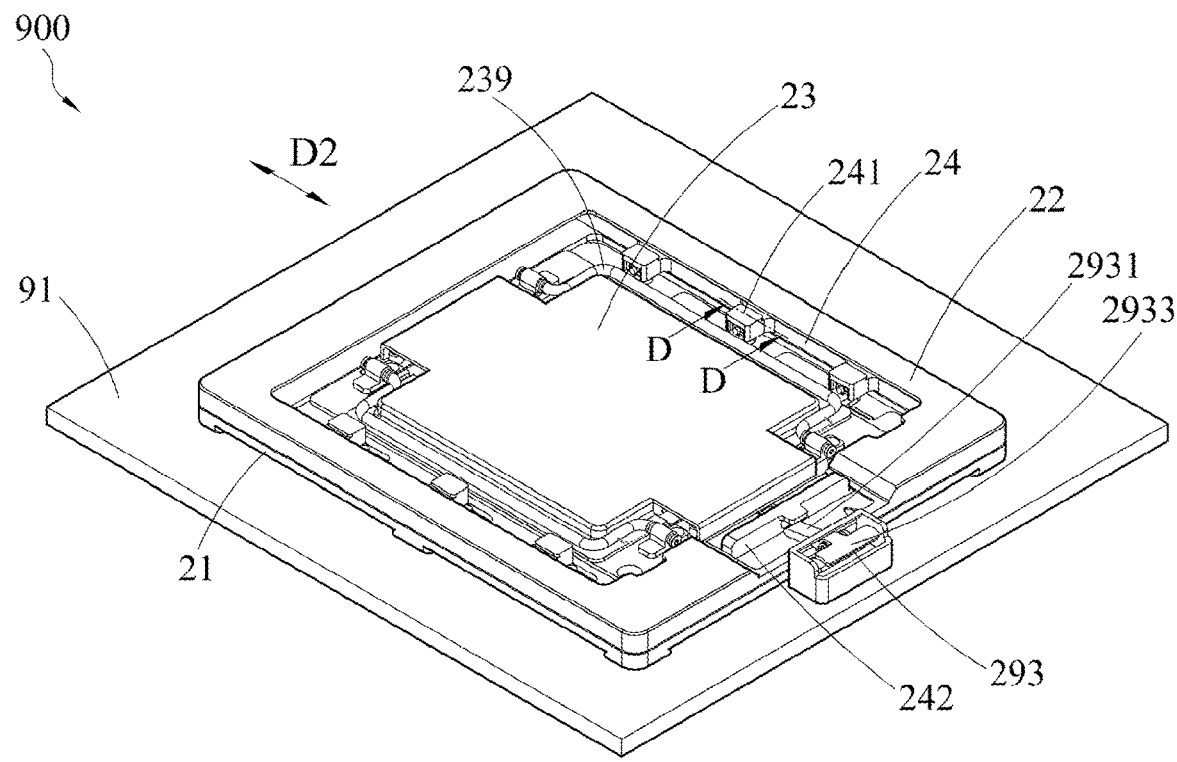
FIG. 11 is a schematic diagram of the probe module according to the second embodiment of the present invention in a fixed state.

The probe card module 200 mainly includes a first strengthening board 21, a fixed frame 22, a probe module 23, and a slidable frame 24. The first strengthening board 21 includes a top surface 21a, a bottom surface 21b, and a mounting hole 21c, where an inner wall of the mounting hole 21c includes an inner flange 21d. The first strengthening board 21 may be made of a metal material, for example, aluminum, aluminum alloy, or another metal material, and is used for combining with one side of the test circuit board 91 (as shown in FIG. 10 and FIG. 11) to strengthen the rigidity of the test circuit board 91. The fixed frame 22 is disposed on the top surface 21a of the first strengthening board 21 and surrounds the mounting hole 21c. The probe module 23 is disposed in the mounting hole 21c and includes a top surface 23a, a bottom surface 23b, and an outer flange 23d located between the top surface 23a and the bottom surface 23b. The outer flange 23d includes a physical region 23e and a plurality of gap regions 23f (six gap regions 23f are drawn in the figure), and the physical region 23e of the outer flange 23d abuts against a top surface of the inner flange 21d of the first strengthening board 21. In addition, two lifting rings 239 that are convenient for personnel to lift the probe module 23 are disposed on the top surface 23a of the probe module 23, and the two lifting rings 239 may stand relative to the top surface 23a of the probe module 23 or be flat attached to the top surface 23a of the probe module 23.

Figure 8A:
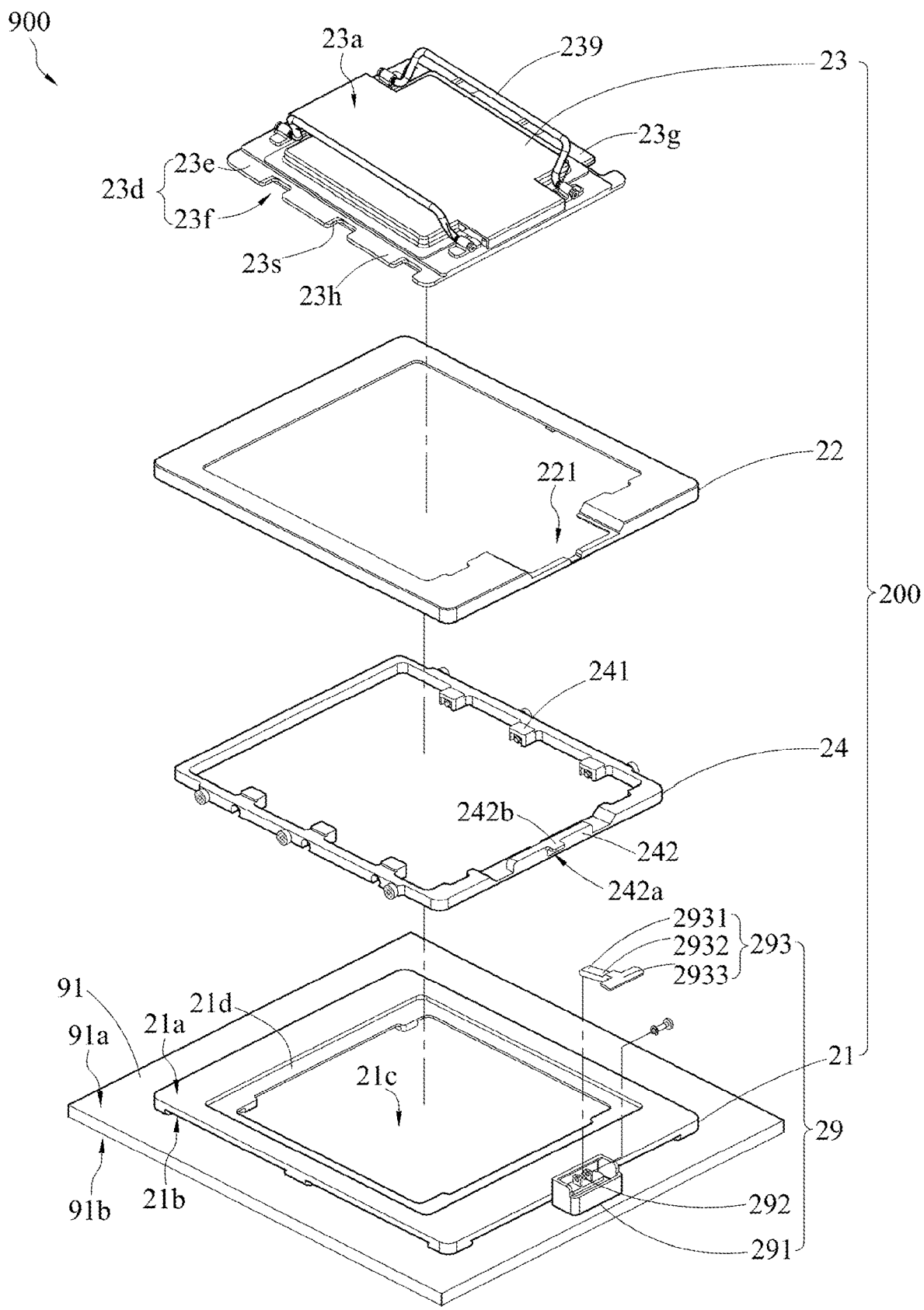
FIG. 8A is a schematic exploded view of elements of a probe card according to a second embodiment of the present invention.
Figure 8B:
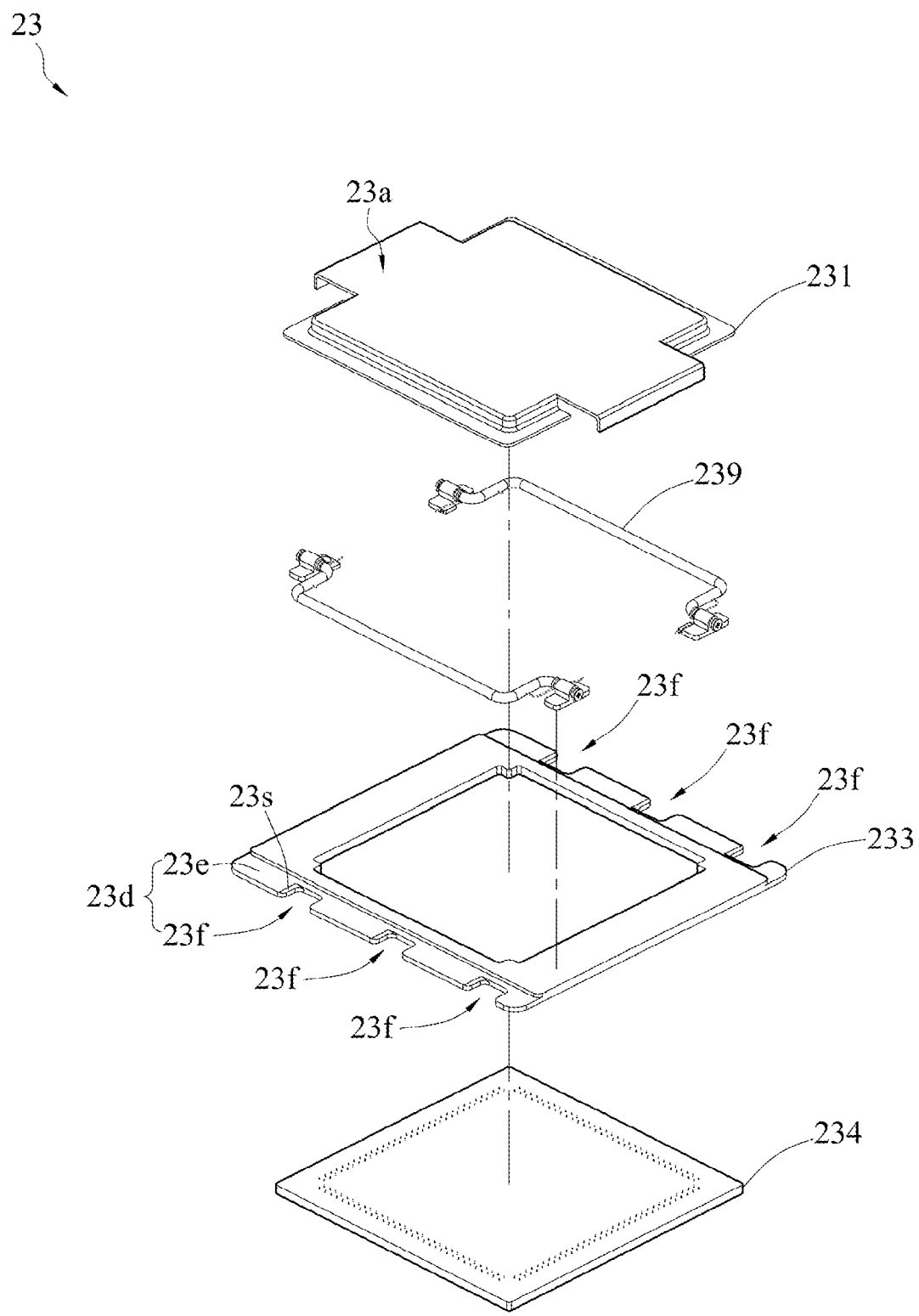
FIG. 8B is a schematic exploded view of elements of a probe module according to the second embodiment of the present invention.
Figure 14:
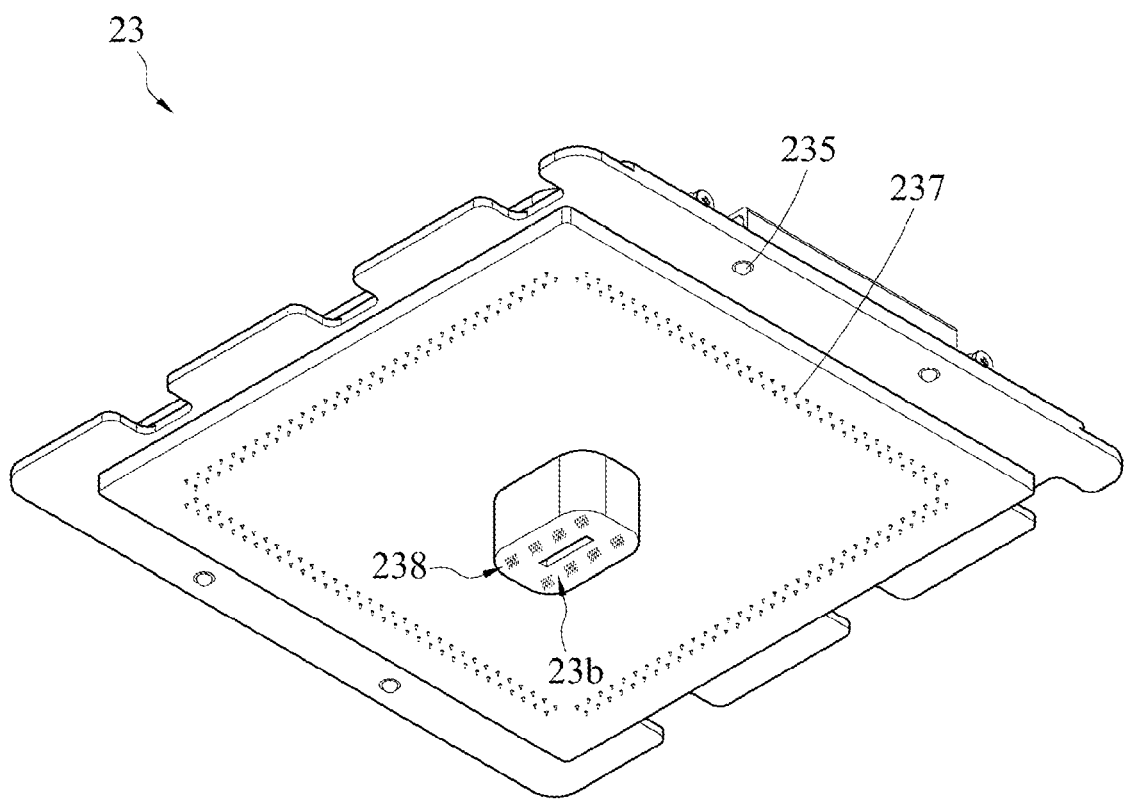
FIG. 14 is a schematic diagram of a bottom of the probe module according to the second embodiment of the present invention.

As shown in FIG. 8B and FIG. 14, the probe module 23 includes an upper cover 231, a second strengthening board 233, and a circuit substrate 234 from top to bottom. The outer flange 23d of the probe module 23 is located on the second strengthening board 233, the top surface 23a of the probe module 23 is a top surface of the upper cover 231, and the bottom surface 23b of the probe module 23 is a bottom surface of the circuit substrate 234. In addition, the two lifting rings 239 are fastened to the second strengthening board 233. A top surface of the circuit substrate 234 is fixedly connected to a bottom surface of the second strengthening board 233.

Referring to FIG. 8B, FIG. 10, and FIG. 11, in some embodiments, the outer flange 23d of the probe module 23 includes a first side 23g and a second side 23h that are opposite and parallel to each other, and the first side 23g and the second side 23h are parallel to an axial direction D2. The gap regions 23f of the outer flange 23d of the probe module 23 are respectively located on the first side 23g and the second side 23h, and a quantity of the gap regions 23f located on the first side 23g is equal to that of the gap regions 23f located on the second side 23h. In addition, each of the gap regions 23f individually corresponds to one of the pressing portions 241 of the slidable frame 24, so that a quantity of the pressing portions 241 is also equally distributed along two sides of the axial direction D2. The outer flange 23d of the probe module 23 is located on the second strengthening board 233.

The slidable frame 24 is disposed on an inner wall of the fixed frame 22 and is slidable between a released position (a state shown in FIG. 10) and a fixed position (a state shown in FIG. 11) along an axial direction D2 (a direction indicated by an arrow shown in FIG. 10 and FIG. 11). A plurality of pressing portions 241 (six pressing portions 241 are drawn in the figure) are disposed on an inner wall of the slidable frame 24. When the slidable frame 24 is located at the released position shown in FIG. 10, each of the pressing portions 241 individually corresponds to one of the gap regions 23f of the outer flange 23d of the probe module 23. When the slidable frame 24 is located at the fixed position shown in FIG. 11, each of the pressing portions 241 presses the physical region 23e of the outer flange 23d of the probe module 23.

Through the foregoing embodiment, assembly and disassembly of the probe module 23 can be implemented only by controlling the slidable frame 24 to slide relative to the fixed frame 22 along the axial direction D2. When an assembly process is to be performed, the slidable frame 24 may be first slid along the axial direction D2 to the released position shown in FIG. 10, and then the probe module 23 is placed in the mounting hole 21c of the first strengthening board 21. Afterward, the assembly of the probe module 23 can be completed by only sliding the slidable frame 24 along the axial direction D2 to the fixed position shown in FIG. 11. Similarly, when the disassembly of the probe module 23 is to be performed by personnel, the foregoing assembly process only needs to be reversely performed.

Referring to FIG. 10 to FIG. 14, each of the pressing portions 241 of this embodiment includes a housing 2411 and a roller 2413. The housing 2411 is fixedly connected to the inner wall of the slidable frame 24 and has an opening 2411a. The roller 2413 is disposed in the housing 2411 and partially protrudes from the opening 2411a of the housing 2411. In addition, the physical region 23e of the outer flange 23d of the probe module 23 includes a plurality of ramp structures 23s, and a plurality of elastic protrusions 235 (four elastic protrusions are drawn in the figure) are further disposed on a bottom surface of the physical region 23e. The ramp structures 23s are individually adjacent to the gap regions 23f. Each of the elastic protrusions 235 protrudes from the bottom surface of the physical region 23e to enable the physical region 23e of the outer flange 23d to abut against the top surface of the inner flange 21d of the first strengthening board 21 through the elastic protrusion 235.

It is likely that because of a surface that is not completely flat, after the outer flange 23d of the probe module 23 and the inner flange 21d of the first strengthening board 21 are assembled with each other, tips of probes (not shown) of the probe module 23 are not on the same level during the test. The foregoing problem can be resolved through elastic deformation of the elastic protrusion 235 by disposing the elastic protrusion 235 on the bottom surface of the outer flange 23d of the probe module 23. It should be particularly noted that, the elastic protrusion 235 may further be disposed on the top surface of the inner flange 21d of the first strengthening board 21. In some embodiments, the elastic protrusion 235 can be implemented by embedding a spring and a steel ball into the bottom surface of the outer flange 23d of the probe module 23. A height by which the steel ball protrudes from the bottom surface of the outer flange 23d may be changed through deformation of the spring.

Figure 12:
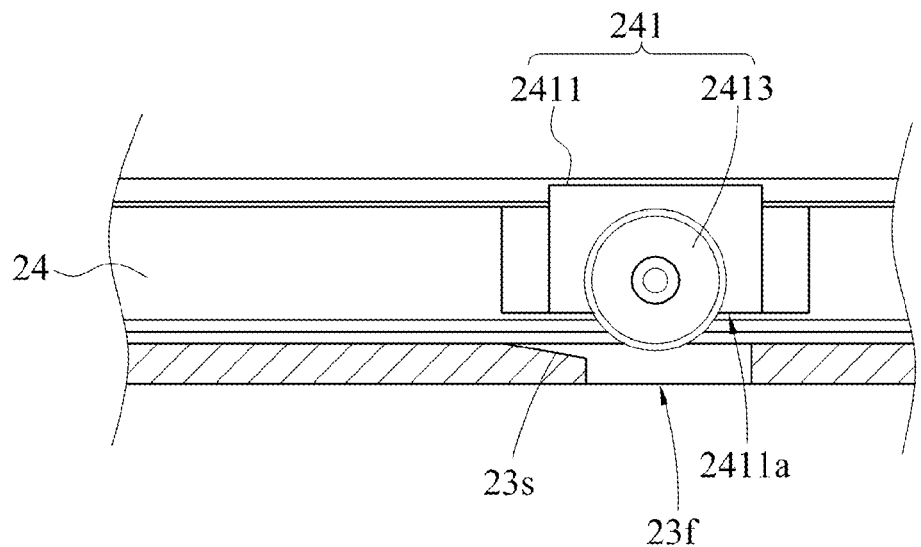
FIG. 12 is a schematic cross-sectional view of a pressing portion according to the second embodiment of the present invention along a section line CC in FIG. 10.
Figure 13:
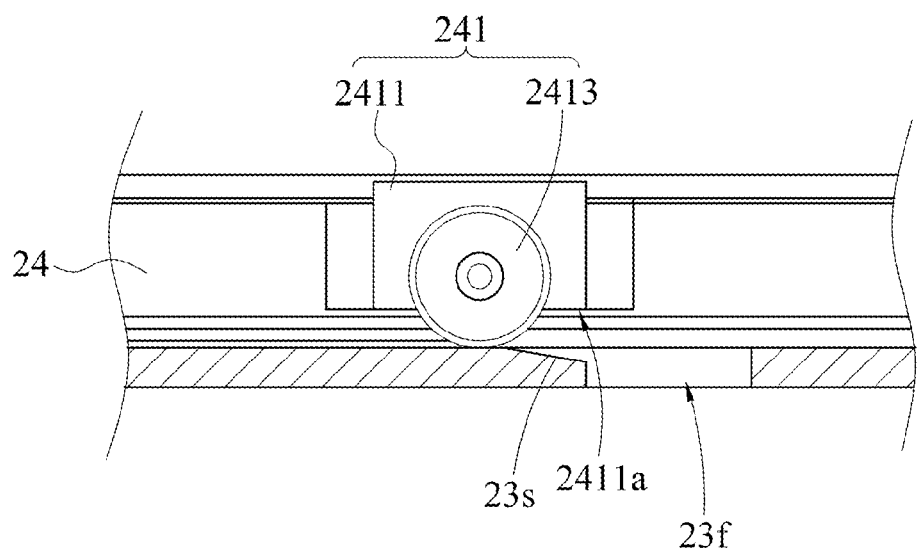
FIG. 13 is a schematic cross-sectional view of a pressing portion according to the second embodiment of the present invention along a section line DD in FIG. 11.

When the slidable frame 24 is located at the released position shown in FIG. 10 and FIG. 12, a position of the roller 2413 of each of the pressing portion 241 is above the gap region 23f of the outer flange 23d of the probe module 23, that is, the roller 2413 is not in contact with the physical region 23e of the outer flange 23d of the probe module 23. In this case, a lower edge of the roller 2413 presents a state of being slightly lower than a top surface of the physical region 23e of the outer flange 23d of the probe module 23. When the slidable frame 24 is pushed to slide to the fixed position shown in FIG. 11 and FIG. 13, the roller 2413 of each of the pressing portions 241 moves and climbs along a surface of the ramp structure 23s from a gap region 23f corresponding thereto, and further moves to the physical region 23e and applies downward pressure to the physical region 23e. In this case, the height by which the elastic protrusion 235 protrudes from the bottom surface of the outer flange 23d of the probe module 23 is reduced due to the downward pressure.

Figure 9:
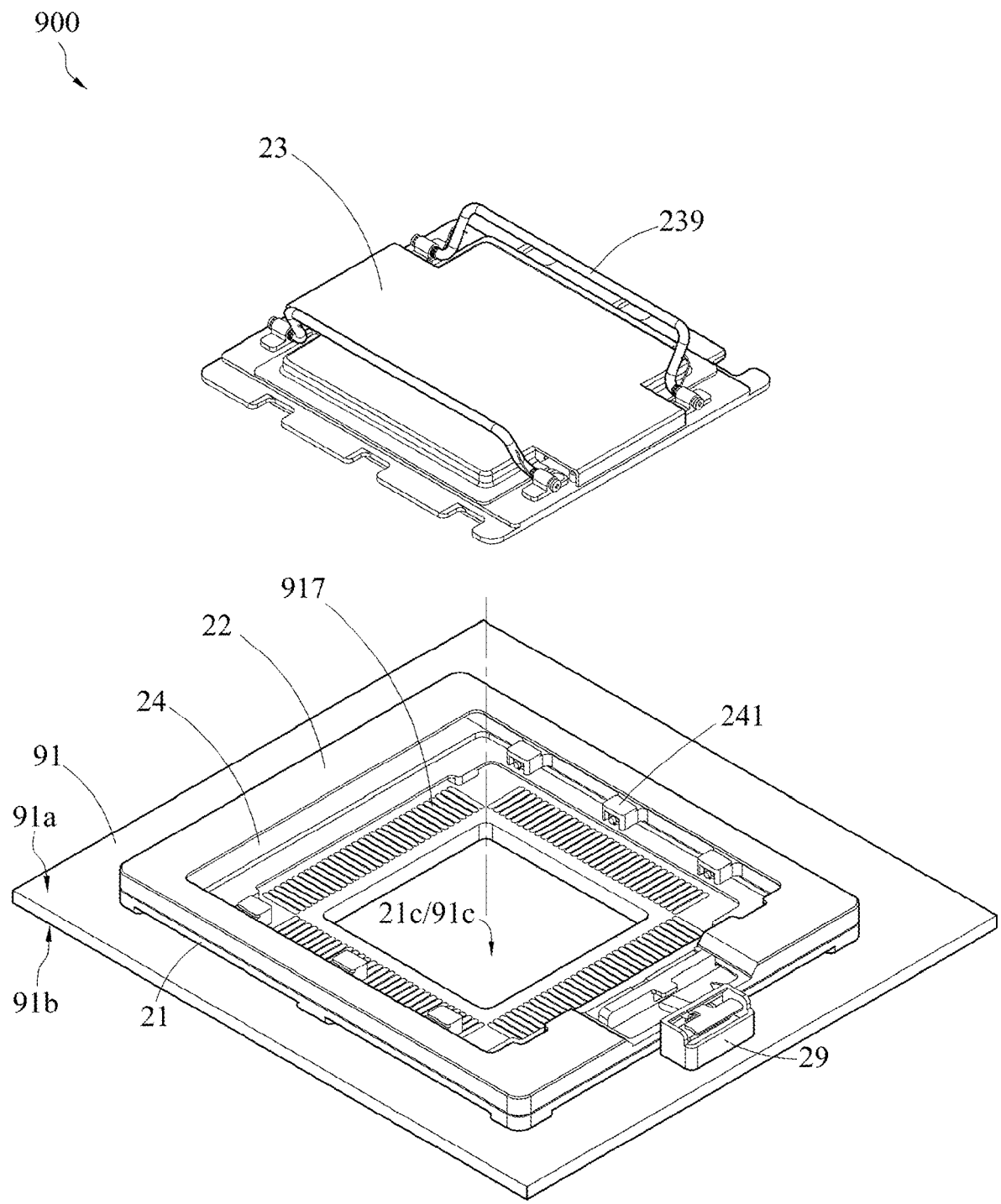
FIG. 9 is a schematic diagram of a combination of the probe module according to the second embodiment of the present invention and a strengthening board.

Referring to FIG. 8A and FIG. 9, in some embodiments, the fixed frame 22 of the probe card component 200 has a notch 221, and the slidable frame 24 includes a handle portion 242. The handle portion 242 is located in the notch 221 of the fixed frame 22 and has a positioning hole 242a. The probe card component 200 further includes a stop mechanism 29 disposed closely adjacent to the notch 221. The stop mechanism 29 includes a base body 291, a spring 292 and a stop member 293. The base body 291 is disposed opposite to the handle portion 242 and adjacent to the notch 221. The spring 292 (such as a torsion spring or a V-shaped spring) is pivotally disposed on the base body 291. The stop member 293 is generally T-shaped and includes a first end 2931, a second end 2933, and a middle section 2932. The first end 2931 is opposite to the second end 2933 and faces the handle portion 242, and the middle section 2932 is located between the first end 2931 and the second end 2933, and is pivotally connected to the spring 292, so that the stop member 293 may form a seesaw structure by using the spring 292 as a fulcrum.

When the slidable frame 24 is located at the fixed position shown in FIG. 11, the first end 2931 of the stop member 293 rotates downward relative to the spring 292 by using an elastic force of the spring 292 to abut against a lower edge of the handle portion 242. In this way, the slidable frame 24 can be prevented from accidentally sliding from the fixed position to the released position. When the personnel attempt to remove the probe module 23, the second end 2933 of the stop member 293 only needs to be pressed, so that the first end 2931 of the stopper 293 tilts up and is aligned with the positioning hole 242a of the handle portion 242. Since a size of the positioning hole 242a can allow the first end 2931 and the middle section 2932 of the stop member 293 to pass, the personnel can operate the handle portion 242 to slide the slidable frame along the axial direction D2 to the released position shown in FIG. 10.

In some embodiments, to help the personnel to quickly align the first end 2931 with the positioning hole 242a, a limiting flange 242b is further disposed on the handle portion 242, and is adjacent to the positioning hole 242a, and is located above the positioning hole 242a. When the personnel press the second end 2933 of the stop member 293, to make the first end 2931 of the stop member 293 tilt up to abut against the limiting flange 242b, the first end 2931 is exactly aligned with the positioning hole 242a. In this way, either disassembly or assembly of the probe module 23 can be quickly completed by the personnel.

Referring to FIG. 8A, FIG. 8B, FIG. 9, and FIG. 14, a plurality of pogo pins (conductors) 237 and a plurality of probes 238 are disposed on the bottom surface 23b of the circuit substrate 234 of the probe module 23 of this embodiment. The test circuit board 91 includes a top surface 91a, a bottom surface 91b, a through hole 91c, and a plurality of electrical contacts 917. The electrical contacts 917 of the test circuit board 91 are located on the top surface 91a and around the through hole 91c. When the probe card component 200 and the test circuit board 91 are assembled to form the probe card 900, the test circuit board 91 has the top surface 91a thereof fixedly connected to the bottom surface 21b of the first strengthening board 21, and the through hole 91c of the test circuit board 91 is opposite to the mounting hole 21c of the first strengthening board 21. One end of each of the pogo pins 237 of the circuit substrate 234 located on the probe module 23 is electrically connected to the electrical contact 917 of the test circuit board 91, and the other end is electrically connected to the circuit substrate 234 of the probe module 23, so that a test signal may be transmitted from the test circuit board 91 to each of the probes 238 through the circuit substrate 234. In addition, the probes 238 of the probe module 23 protrude from the bottom surface 91*b* of the test circuit board 91, so that when the probe card 900 is assembled on a test machine, and an electrical test is performed on a solder pad on a to-be-tested device by using the probes 238.

What is claimed is:

1. A probe card, comprising:
   a first strengthening board, comprising a top surface, a bottom surface, and a mounting hole, wherein an inner wall of the mounting hole comprises an inner flange;
   a fixed frame, disposed on the top surface of the first strengthening board and surrounding the mounting hole;
   a probe module, disposed in the mounting hole, wherein the probe module comprises a top surface, a bottom surface, and an outer flange located between the top surface and the bottom surface, the outer flange comprises a physical region and a plurality of gap regions, and the physical region of the outer flange abuts against the inner flange of the first strengthening board, the probe module further comprises a circuit substrate, the bottom surface of the probe module is a bottom surface of the circuit substrate, and the bottom surface of the circuit substrate is provided with a plurality of conductors and a plurality of probes;
   a slidable frame, disposed on an inner wall of the fixed frame and being slidable between a released position and a fixed position along an axial direction, wherein a plurality of pressing portions are disposed on an inner wall of the slidable frame, when the slidable frame is located at the released position, each of the pressing portions individually corresponds to one of the gap regions of the outer flange of the probe module, and when the slidable frame is located at the fixed position, and each of the pressing portions presses the physical region of the outer flange of the probe module; and
   a test circuit board, comprising a top surface, a bottom surface, a through hole, and a plurality of electrical contacts, the electrical contacts are located on the top surface of the test circuit board and around the through hole, the top surface of the test circuit board is fixedly connected to the bottom surface of the first strengthening board, the through hole of the test circuit board is opposite to the mounting hole of the first strengthening board, the conductors of the probe module are individually electrically connected to the electrical contacts of the test circuit board and the circuit substrate, and the probes of the probe module protrude from the bottom surface of the test circuit board.

2. The probe card according to claim 1, wherein the outer flange comprises a first side and a second side opposite to each other, the first side and the second side are parallel to the axial direction, and the gap regions are located on the first side and the second side, and a quantity of the gap regions located on the first side is equal to that of the gap regions located on the second side.

3. The probe card according to claim 2, wherein each of the pressing portions comprises:
   a housing, connected to the inner wall of the slidable frame, and comprising an opening and an end wall opposite to the opening;
   an elastic body, disposed in the housing, and having one end connected to the end wall; and
   a roller, connected to the other end of the elastic body, wherein
   when the slidable frame is located at the fixed position, the roller of each of the pressing portions presses against the physical region of the outer flange of the probe module.

4. The probe card according to claim 3, wherein the physical region of the outer flange comprises a plurality of ramp structures, the ramp structures are individually adjacent to the gap regions, and when the slidable frame slides from the released position to the fixed position, the roller of each of the pressing portions moves from a gap region corresponding thereto to the physical region of the outer flange along the ramp structure.

5. The probe card according to claim 2, wherein each of the pressing portions comprises:
   a housing, connected to the inner wall of the slidable frame, and comprising an opening; and
   a roller, disposed in the housing and partially protruding from the opening of the housing, wherein
   when the slidable frame is located at the fixed position, the roller of each of the pressing portions presses against the physical region of the outer flange of the probe module.

6. The probe card according to claim 1, wherein the fixed frame comprises a through hole, the through hole comprises a first inner wall surface and a second inner wall surface opposite to each other, and the slidable frame comprises a handle portion, the handle portion passes through the through hole, when the slidable frame is located at the released position, the handle portion abuts against the first inner wall surface of the through hole, and when the slidable frame is located at the fixed position, the handle portion abuts against the second inner wall surface of the through hole.

7. The probe card according to claim 6, wherein the physical region of the outer flange comprises a plurality of ramp structures, the ramp structures are individually adjacent to the gap regions, and when the slidable frame slides from the released position to the fixed position, each of the pressing portions slides from a gap region corresponding thereto along the ramp structure to abut against the physical region of the outer flange.

8. The probe card according to claim 6, wherein the fixed frame comprises a notch, the slidable frame comprises a handle portion, the handle portion is located in the notch, and the probe card further comprises:
   a base body, disposed opposite to the handle portion and adjacent to the notch;
   a spring, disposed on the base body; and
   a stop member, comprising a first end, a second end, and a middle section, wherein the first end is opposite to the second end and faces the handle portion, the middle section is located between the first end and the second end and is pivotally connected to the spring, and when the slidable frame is located at the fixed position, the first end rotates relative to the spring by using an elastic force of the spring to abut against the handle portion.

9. The probe card according to claim 8, wherein the handle portion comprises a positioning hole, a size of the positioning hole allows the first end and the middle section of the stop member to pass, when the slidable frame is located at the fixed position, the first end abuts against a lower edge of the positioning hole, and when the second end of the stop member is subject to a force to enable the first end to rotate relative to the spring and point to the positioning hole, the slidable frame is slidable from the fixed position to the released position.

10. The probe card according to claim 1, wherein at least one ball plunger is further disposed on the inner wall of the fixed frame, an outer wall of the slidable frame is further provided with at least one positioning hole, and when the slidable frame is located at the fixed position, the ball plunger is embedded into the positioning hole.

11. The probe card according to claim 10, wherein a plurality of elastic protrusions are disposed on the bottom surface of the physical region of the outer flange of the probe module, and each of the elastic protrusions protrudes from the bottom surface of the physical region to enable the physical region of the outer flange to abut against the top surface of the inner flange of the first strengthening board through the elastic protrusion.

12. The probe card according to claim 10, wherein a plurality of elastic protrusions are disposed on the top surface of the inner flange of the first strengthening board, and each of the elastic protrusions protrudes from the top surface of the inner flange to enable the physical region of the outer flange to abut against the top surface of the inner flange of the first strengthening board through the elastic protrusion.

13. The probe card according to claim 1, wherein the probe module further comprises a second strengthening board, the top surface of the circuit substrate of the probe module is fixedly connected to a bottom surface of the second strengthening board, and the outer flange of the probe module is located on the second strengthening board.

\* \* \* \* \*